United States Patent [19]
Tsuruda et al.

[11] Patent Number: 5,815,428
[45] Date of Patent: Sep. 29, 1998

[54] SEMICONDUCTOR MEMORY DEVICE HAVING HIERARCHICAL BIT LINE STRUCTURE

[75] Inventors: Takahiro Tsuruda; Masaki Tsukude, both of Hyogo, Japan

[73] Assignee: Mitsubishi Denki Kabushiki Kaisha, Tokyo, Japan

[21] Appl. No.: 893,045

[22] Filed: Jul. 14, 1997

Related U.S. Application Data

[63] Continuation of Ser. No. 598,581, Feb. 12, 1996, abandoned.

[30] Foreign Application Priority Data

Feb. 22, 1995 [JP] Japan .................................. 7-033918

[51] Int. Cl.$^6$ ...................................................... G11C 5/06
[52] U.S. Cl. .............................. 365/63; 365/72; 365/51; 365/149
[58] Field of Search .............................. 365/72, 51, 149, 365/63, 52

[56] References Cited

U.S. PATENT DOCUMENTS

5,495,440   2/1996   Asakura .................................. 365/149

FOREIGN PATENT DOCUMENTS

6-349267   4/1994   Japan .

OTHER PUBLICATIONS

"Nand–Structured Cell Technologies for 256 Mb Drams", Yamada et al., Technical Report of IEICE SDM94–18, ICD94–29 (1994–05) pp, 13–18.

"Nand–Structured Cell Technologies for Low Cost 256 Mb Drams", Hamamoto et al., IEDM 93, 1993 pp. 643–646.

Primary Examiner—Huan Hoang
Attorney, Agent, or Firm—McDermott, Will & Emery

[57] ABSTRACT

A semiconductor memory device includes a semiconductor substrate, a plurality of sub bit line pairs formed on the semiconductor substrate, a main bit line pair formed at a layer above the plurality of sub bit line pairs, a plurality of selecting transistors, a plurality of word lines located to cross the sub bit line pairs, and a plurality of memory cells. Each selecting transistor is provided corresponding to one sub bit line and has one source/drain region connected to a corresponding sub bit line. At a layer above the other source/drain region of the selecting transistor, an intermediate layer is formed in the same layer as that of a storage node of memory cell. The intermediate layer is connected to the other source/drain region of the selecting transistor through a contact hole formed beneath it. The intermediate layer is further connected to the main bit line through another contact hole formed on the intermediate layer.

21 Claims, 13 Drawing Sheets

SEMICONDUCTOR MEMORY DEVICE HAVING HIERARCHICAL BIT LINE STRUCTURE

This application is a continuation of application Ser. No. 08/598,581 filed Feb. 12, 1996 now abandoned.

CROSS-REFERENCE TO RELATED APPLICATION

This application is related to coapplication Ser. No. 08/226,485, filed Apr. 12, 1994, now abandoned, commonly assigned with the present invention.

BACKGROUND OF THE INVENTION

1. Field of the Invention

The present invention relates to a semiconductor memory device, and more particularly to an improvement in a dynamic random access memory (DRAM) having a hierarchical (divided) bit line structure.

2. Description of the Background Art

Conventionally, a DRAM having a so-called hierarchical bit line structure has been proposed to implement a large memory capacity in a small chip area. For example, in a DRAM having a hierarchical bit line structure disclosed in Japanese Patent Laying-Open No. 6-349267, a plurality of sub bit line pairs are provided corresponding to one main bit line pair, and each sub bit line pair is connected to the main bit line pair through two selecting transistors, respectively. This main bit line pair is formed in a layer above the layer of the sub bit line pairs.

In a DRAM having a hierarchical bit line structure, the main bit line pair must be connected to a source/drain region of the selecting transistor. However, it was difficult to form a contact hole which reaches the source/drain region of the selecting transistor directly from the main bit line, since the side surface of the contact hole would become close to a gate electrode of the selecting transistor.

In general, when making contact between the lower layer such as a storage node or a sub bit line and the silicon substrate, it is easy to form a small contact hole because self-align contact technique can be employed. On the contrary, when making direct contact to the silicon substrate from the upper layer such as the main bit line, such technique cannot be used and it is impossible to form a small contact hole. Accordingly, formation of a contact hole reaching the source/drain region of the selecting transistor directly from the main bit line has been very difficult to achieve since there are not enough margin between the contact hole and the gate electrode of the selecting transistor.

In addition, since the selecting transistors are formed with a prescribed space therebetween, periodicity of the arrangement of the storage nodes is disturbed. When the periodicity of the arrangement of the storage nodes is disturbed, capacitance of various magnitudes would be parasitic on the storage nodes such that their storage capacitance would not be uniform. In order to solve such a problem, a dummy cell having the same shape as that of the memory cell may be formed between the memory cell and the selecting transistor. However, if such a dummy cell is formed, the chip area will be increased.

Furthermore, since the main bit line pair is coupled with the adjacent main bit line pair by parasitic capacitance, there has been a problem that when transition from an L (logical low) level to an H (logical high) level occurs in the potential of one main bit line of the main bit line pair, noise is generated at one main bit line of the adjacent main bit line pair.

SUMMARY OF THE INVENTION

Based upon the foregoing, it is an object of the present invention to reduce the chip area of a semiconductor memory device having a hierarchical bit line structure.

It is another object of the present invention to provide an easier process for connecting a main bit line to source/drain region of a selecting transistor in a semiconductor memory device having a hierarchical bit line structure.

It is still another object of the present invention to reduce the noise generated at a main bit line pair in a semiconductor memory device having a hierarchical bit line structure.

According to one aspect of the present invention, a semiconductor memory device includes a semiconductor substrate, a plurality of sub bit line pairs, a main bit line pair, a plurality of switching portions, a plurality of word lines, and a plurality of memory cells. The plurality of sub bit line pairs are formed on the semiconductor substrate. The main bit line pair is formed along the plurality of sub bit line pairs in the layer above the layer of the plurality of sub bit line pairs. Each of the plurality of switching portions is provided corresponding to one of the one and the other sub bit lines of the plurality of sub bit line pairs. The plurality of switching portions are each connected between the corresponding sub bit line and one of the one and the other main bit lines of the main bit line pair. The plurality of word lines are formed on the semiconductor substrate to cross the plurality of sub bit line pairs. The plurality of memory cells are provided corresponding to the intersection of the plurality of sub bit line pairs and the plurality of word lines. Each of the plurality of memory cells is connected to one of the one and the other sub bit lines of the corresponding sub bit line pair and the corresponding word line. Each of the plurality of switching portions includes a selecting transistor and an intermediate layer. The selecting transistor has one source/drain region. This one source/drain region is formed at the semiconductor substrate and is in connection with the corresponding sub bit line pair. The intermediate layer is in connection with the other source/drain region of the selecting transistor and the corresponding main bit line, and is formed between the layer of the plurality of sub bit line pairs and the layer of the main bit line pair.

Accordingly, since the source/drain regions of the selecting transistor are connected to the main bit line via the intermediate layer in this semiconductor memory device, the connection process is achieved more easily.

According to another aspect of the present invention, a semiconductor memory device includes a semiconductor substrate, a plurality of sub bit line pairs, a main bit line pair, a plurality of selecting transistors, a plurality of word lines, and a plurality of memory cells. The plurality of sub bit line pairs are formed on the semiconductor substrate. The main bit line pair is formed along the plurality of sub bit line pairs in a layer above the layer of the plurality of sub bit line pairs. Each of the plurality of selecting transistors is provided corresponding to one of the one and the other sub bit line of the plurality of sub bit line pairs. Each of the plurality of selecting transistors has one source/drain region. This one source/drain is formed at a semiconductor substrate and is in connection with the corresponding sub bit line pair. The plurality of word lines are formed on the semiconductor substrate to cross the plurality of sub bit line pairs. The plurality of memory cells are provided corresponding to the intersection of the plurality of sub bit line pairs and the plurality of word lines. The plurality of memory cells are each connected to one of the one and the other sub bit lines of the corresponding sub bit line pair and the corresponding word line. The main bit line pair is twisted above one of the plurality of selecting transistors. One and/or the other main bit line of the main bit line pair includes a coupling portion at the portion where it is twisted. The coupling portions are respectively connected with both of its side portions and is formed at a layer between the layer of both of the side portions and the layer of the plurality of sub bit line pairs.

Accordingly, since the main bit line pair is twisted above one of the selecting transistors in this semiconductor memory device, the noise provided from the adjacent main bit line pair is canceled.

According to still another aspect of the present invention, a semiconductor memory device includes a semiconductor substrate, a plurality of sub bit line pairs, a main bit line pair, a plurality of selecting transistors, a plurality of word lines, and a plurality of memory cells. The plurality of sub bit line pairs are formed in a straight line on the semiconductor substrate. Each of the plurality of sub bit line pairs includes one and the other sub bit lines. The other sub bit line is placed along the extension of one sub bit line and has one end located away from the opposite one end of one sub bit line. The main bit line pair is formed along the plurality of sub bit line pairs on the semiconductor substrate and is twisted between one end of one sub bit line and one end of the other sub bit line of one of the plurality of sub bit line pairs. Each of the plurality of selecting transistors is provided responding to one of one and the other bit lines of the plurality of sub bit line pairs. Each of the plurality of selecting transistors are connected to the other end of corresponding sub bit line and one of one main bit line and the other main bit line of the main bit line pair. The plurality of word lines are formed on the semiconductor substrate to cross one and other sub bit lines of the plurality of sub bit line pairs. The plurality of memory cells are provided corresponding to the intersection of one and the other sub bit lines of the plurality of sub bit line pairs and the plurality of word lines. Each of the plurality of memory cells are connected to corresponding sub bit line and corresponding word line.

Accordingly, since the main bit line pair is twisted between one sub bit line and the other sub bit line in this semiconductor memory device, the noise provided from the adjacent other main bit line pair is canceled.

The foregoing and other objects, features, aspects and advantages of the present invention will become more apparent from the following detailed description of the present invention when taken in conjunction with accompanying drawings.

DESCRIPTION OF THE PREFERRED EMBODIMENTS

Figure 1:
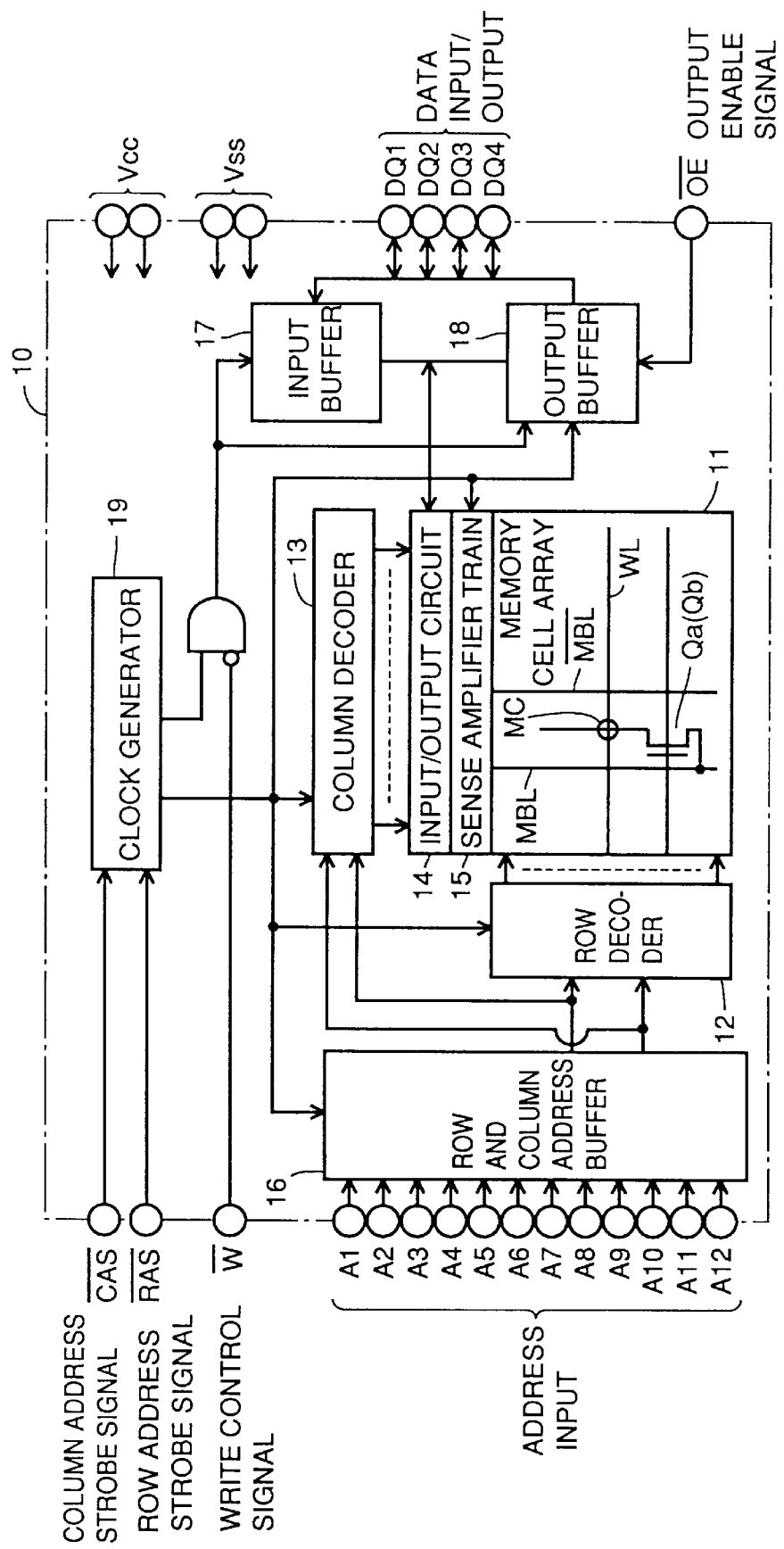
FIG. 1 is a block diagram showing the entire configuration of a DRAM having a hierarchical bit line structure according to Embodiment 1 of the present invention.

Semiconductor memory devices in accordance with the embodiments of the present invention will now be described in detail with reference to the FIGURES. Identical reference characters denote identical or corresponding components in the FIGURES.

Embodiment 1

FIG. 1 is a block diagram showing the entire configuration of a DRAM according to Embodiment 1 of the present invention.

Referring to FIG. 1, this DRAM includes a memory cell array 11 in which a plurality of memory cells MC are placed in a matrix of rows and columns, a row decoder 12 for selecting one row of the memory cell array 11, a column decoder 13 for selecting one column of memory cell array 11, a sense amplifier train 15 for amplifying the data from memory cell array 11, and an input/output circuit 14 for inputting and outputting the data of the column selected by column decoder 13.

This DRAM further includes a row and column address buffer 16 for supplying external address signals A1 to A12 to row decoder 12 as row address signals as well as to column decoder 13 as column address signals, an input buffer 17 for supplying external input data DQ1 to DQ4 to input/output circuit 14, an output buffer 18 for supplying the data from input/output circuit 14 externally as output data DQ1 to DQ4, and a clock generator 19 for generating various control signals in response to row address strobe signal $\overline{RAS}$ and column address strobe signal $\overline{CAS}$. All of these components are formed on one silicon substrate 10.

Figure 2:
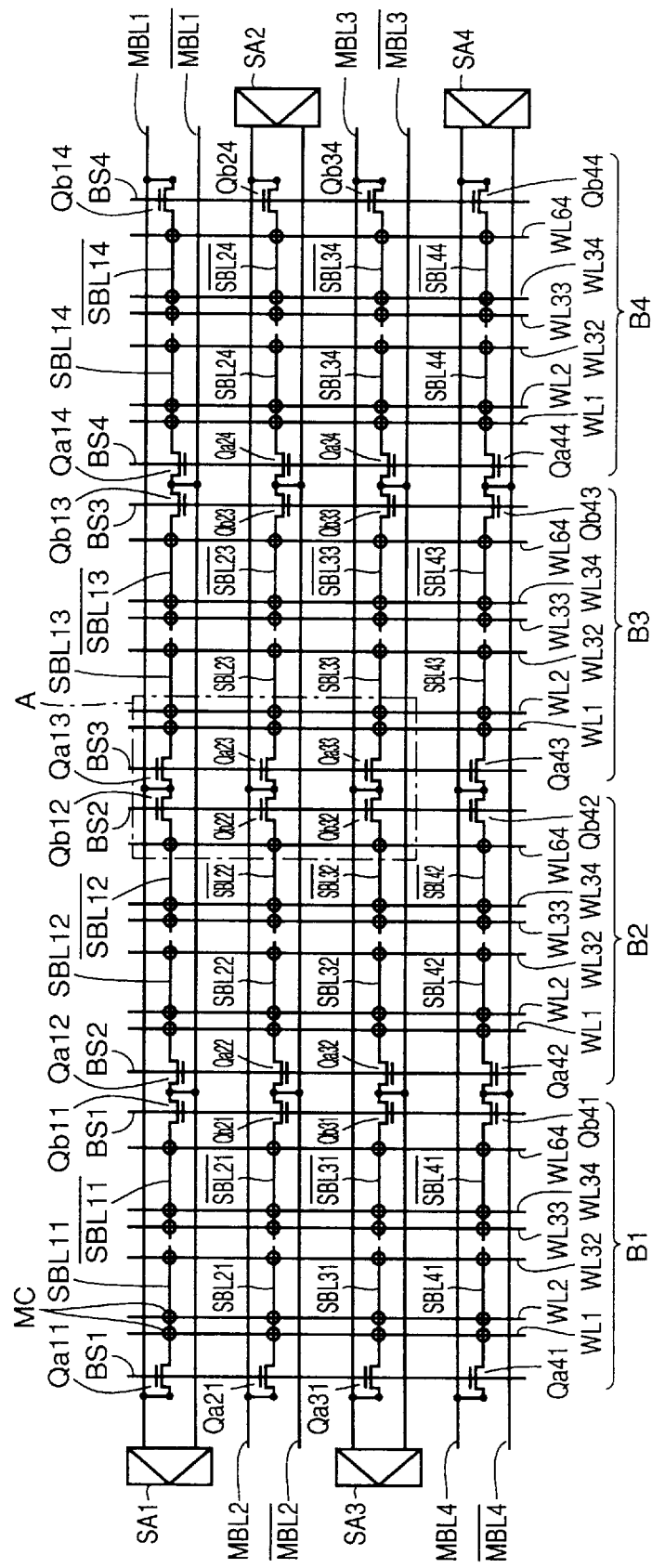
FIG. 2 is a circuit diagram showing a partial configuration of a memory cell array in FIG. 1.

FIG. 2 is a circuit diagram showing four of the columns in memory cell array 11 in FIG. 1. Referring to FIG. 2, memory cell array 11 includes a plurality of main bit line pairs. In FIG. 2, only main bit line pairs MBL1, $\overline{MBL1}$ to MBL4, $\overline{MBL4}$ are shown, representatively. In addition, each main bit line pair has one of sense amplifier connected thereto. In FIG. 2, only sense amplifiers SA1 to SA4 are shown, representatively. Four sub bit line pairs are placed corresponding to each of the main bit line pairs. In FIG. 2, SBL11 and $\overline{SBL11}$ to SBL14 and $\overline{SBL14}$, SBL21 and $\overline{SBL21}$ to SBL24 and $\overline{SBL24}$, SBL31 and $\overline{SBL31}$ to SBL34 and $\overline{SBL34}$, and SBL41 and $\overline{SBL41}$ to SBL44 and $\overline{SBL44}$ are shown, representatively. Sub bit line pairs SBL11, $\overline{SBL11}$ to SBL14, $\overline{SBL14}$ are placed in a straight line along main bit line pair MBL1, $\overline{MBL1}$. Sub bit line pairs SBL11, $\overline{SBL11}$ to SBL14, $\overline{SBL14}$ are placed between main bit line MBL1 and main bit line $\overline{MBL1}$. Sub bit line $\overline{SBL11}$ is placed along the extension of sub bit line SBL11. Other sub bit line pairs are also placed in a manner similar to that of the above-described sub bit line pairs SBL11, $\overline{\text{SBL11}}$ to SBL14, $\overline{\text{SBL14}}$.

Each sub bit line is connected to corresponding one main bit line via a selecting transistor. For instance, sub bit line SBL11 is connected to main bit line MBL1 via a selecting transistor Qa11. Sub bit line $\overline{\text{SBL11}}$ is connected to main bit line $\overline{\text{MBL1}}$ via a selecting transistor Qb11. Selecting transistors Qa11 to Qa44 and Qb11 to Qb44 are formed of n channel MOS transistors.

Meanwhile, this memory cell array 11 consists of four blocks B1 to B4. For example, in block B1, word lines WL1 to WL32 are located to cross sub bit lines SBL11, SBL21, SBL31 and SBL41. In addition, word lines WL33 to WL64 are located to cross sub bit lines $\overline{\text{SBL11}}$, $\overline{\text{SBL21}}$, $\overline{\text{SBL31}}$ and $\overline{\text{SBL41}}$. Similarly to this block B1, word lines WL1 to WL64 are located to cross the sub bit lines in other blocks B2 to B4 as well A plurality of memory cells MC are located corresponding to intersections of the sub bit lines and the word lines. Each memory cell MC is connected to corresponding sub bit line and corresponding word line. Each memory cell MC includes an access transistor formed of an n channel MOS transistor, and a stacked capacitor. The access transistor is connected between the corresponding sub bit line and the stacked capacitor. The gate electrode of the access transistor is connected to the corresponding word line.

Furthermore, in block B1, for example, gate electrodes of selecting transistors Qa11, Qa21, Qa31 and Qa41 are commonly connected with one block selecting line BS1 lying parallel to word lines WL1 to WL64. Gate electrodes of selecting transistors Qb11, Qb21, Qb31 and Qb41 are connected commonly with another block selecting line BS1 lying parallel to word lines WL1 to WL64. These two block selecting lines BS1 are provided with synchronous block selecting signals, respectively. Selecting transistors in other blocks B2 to B4 are configured similarly to the selecting transistors in this block B1.

As described above, this DRAM has a hierarchical bit line structure including folded main bit line pairs and open sub bit line pairs. Brief description will now be made on the reading operation of a DRAM having such hierarchical bit line structure.

When block selecting signal at H level is applied to block selecting line BS1 only, for example, all of selecting transistors Qa11, Qa21, Qa31, Qa41, Qb11, Qb21, Qb31 and Qb41 in block B1 are turned on. As a result, block B1 is selected and data from memory cell MC in block B1 become readable.

Thereafter, when one of the word lines WL1 to WL64 is boosted, data is read out to the sub bit lines from all memory cell MC connected to that boosted word line. For instance, when WL1 is boosted, data is read out to sub bit lines SBL1, SBL21, SBL31, and SBL41 from all of memory cells MC that is connected to this word line WL1. The sub bit lines are precharged in advance at a prescribed potential (e.g., half the potential of the power supply potential, Vcc/2), but the potential of sub bit lines SBL11, SBL21, SBL31 and SBL41 to which data are read out is slightly changed from that prescribed potential. Meanwhile, since no data is read out to sub bit lines $\overline{\text{SBL11}}$, $\overline{\text{SBL21}}$, $\overline{\text{SBL31}}$ and $\overline{\text{SBL41}}$ which are paired with these sub bit lines SBL11, SBL21, SBL31 and SBL41, their potentials are maintained at the prescribed potential. Accordingly, a potential difference occurs between sub bit line SBL11 and sub bit line $\overline{\text{SBL11}}$. Potential differences would also occur between other sub bit line pairs as in this sub bit line pair SBL11 and $\overline{\text{SBL11}}$.

For example, potential of sub bit line SBL11 is applied to main bit line MBL1 since selecting transistor Qa11 is turned on. Meanwhile, potential of sub bit line $\overline{\text{SBL11}}$ is applied to main bit line $\overline{\text{MBL1}}$ since selecting transistor Qb11 is turned on. Accordingly, the potential difference generated between sub bit line pair SBL11 and $\overline{\text{SBL11}}$ also occurs between main bit line pair MBL1 and $\overline{\text{MBL1}}$. Similarly, potential difference would occur in other main bit line pairs as in this main bit line pair MBL1 and $\overline{\text{MBL1}}$.

The potential difference generated in each main bit line pair is amplified by a corresponding sense amplifier. For example, the potential difference in main bit line pair MBL1, $\overline{\text{MBL1}}$ is amplified by sense amplifier SA1, and as a result, the potential of one of main bit lines MBL1 and $\overline{\text{MBL1}}$ attains H level, and the potential of the other main bit line attains L level. The data thus amplified by sense amplifiers SA1 to SA4 are output via input/output circuit 14 and output buffer 18 shown in FIG. 1.

Figure 3:
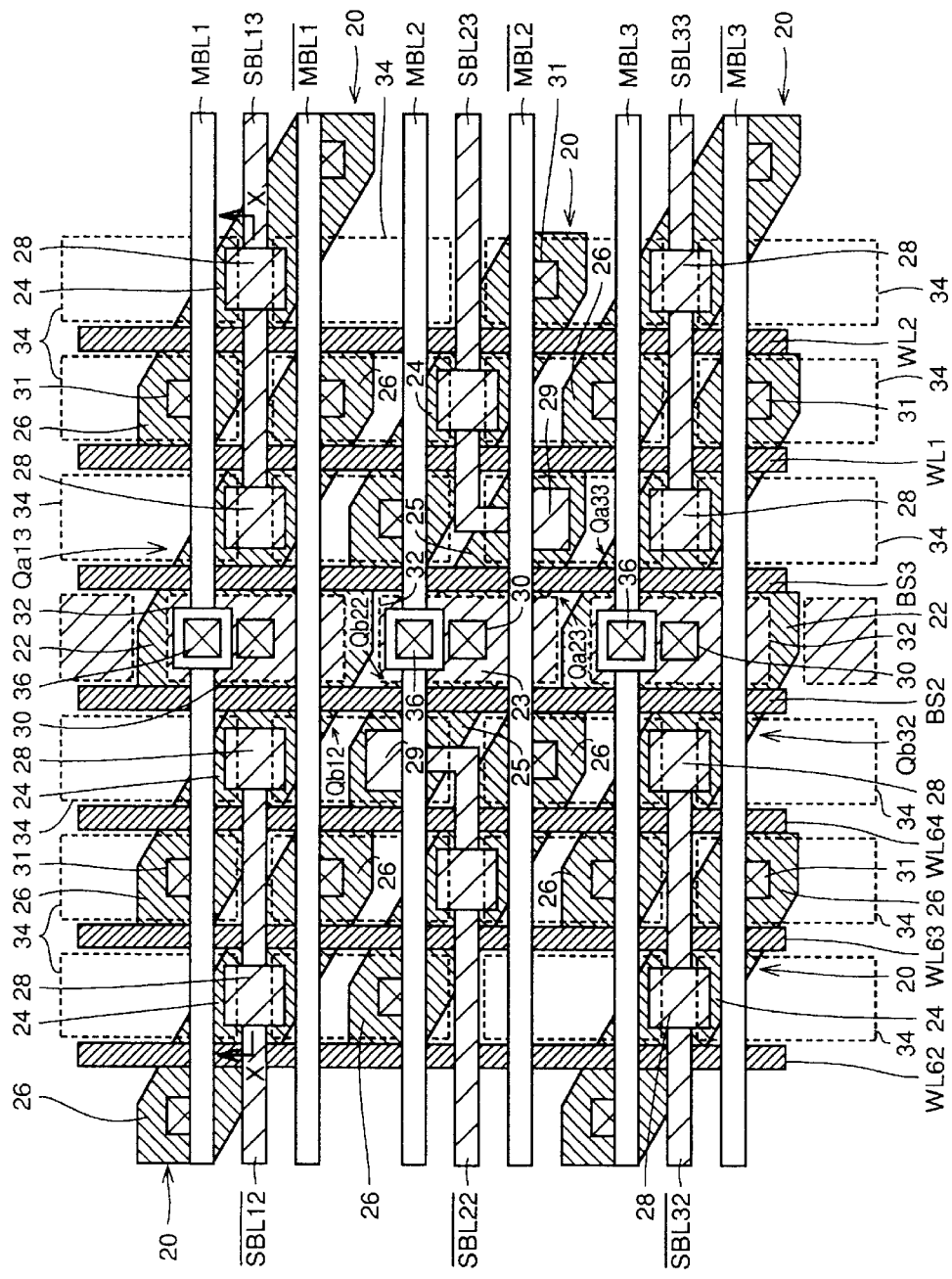
FIG. 3 is a layout diagram showing a specific configuration of the portion shown as region A in FIG. 2.
Figure 4:
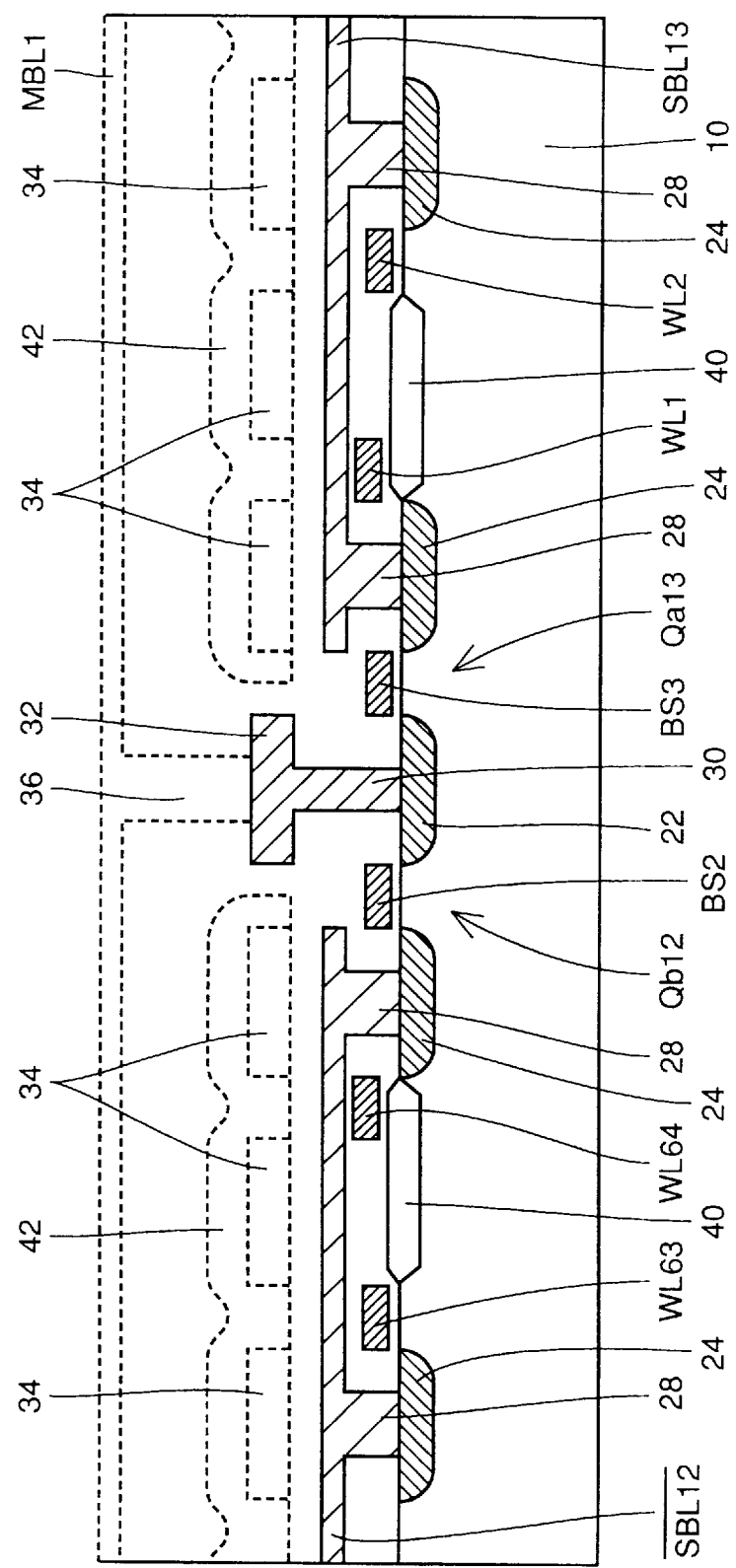
FIG. 4 is a cross sectional view taken along line X—X in FIG. 3.

FIG. 3 is a layout diagram showing the specific configuration of the portion denoted by A in FIG. 2. FIG. 4 is a cross sectional view taken along line X—X in FIG. 3. Referring to FIG. 3 and FIG. 4, field regions 20 are formed regularly on p type silicon substrate 10. At regions other than field regions 20, LOCOS (Locational Oxidation of Silicon) isolation films 40 are formed. On silicon substrate 10, word lines and block selecting lines are formed in parallel with a thin gate oxide film therebetween. In FIG. 3, word lines WL62, WL63, WL64, WL1 and WL2, and block selecting lines BS2 and BS3 are shown.

A word line forms the gate electrode of an access transistor. Accordingly, the access transistor of the memory cell is formed by source/drain regions 24 and 26 in field region 20 and the word line. Two adjacent access transistors share source/drain region 24 therebetween.

Block selecting line forms the gate electrode of the selecting transistor. Accordingly, the selecting transistor is formed by source/drain regions 22 and 24 in field region 20 and the block selecting line. The selecting transistor and the adjacent access transistor share the source/drain region 24 therebetween. As shown in FIG. 3, source/drain region 22 of selecting transistor Qb12 is provided commonly to selecting transistor Qa13. Source/drain region 22 of selecting transistor Qb32 is provided commonly to selecting transistor Qa33. Source/drain region 23 of selecting transistor Qb22 is provided commonly to selecting transistor Qa23.

A contact hole 28 is formed on source/drain region 24. A contact hole 29 is formed on source/drain region 25. The sub bit line is connected to source/drain region 24 through contact hole 28. Sub bit lines $\overline{\text{SBL22}}$ and SBL23 are further connected to source/drain region 25 through contact hole 29.

A contact hole 31 is formed on source/drain region 26. A contact hole 30 is formed on source/drain region 22. A storage node 34 is formed on contact hole 31. Accordingly, storage node 34 is connected to source/drain region 26 through contact hole 31. An intermediate pad 32 is formed on contact hole 30. Therefore, intermediate pad 32 is in connection with source/drain region 22 through contact hole 30. These storage node 34 and intermediate pad 32 are formed by, for example, patterning a single polycrystalline silicon layer. Thus, intermediate pad 32 is formed at the same layer as storage node 34. The shape of this intermediate pad 32 is substantially the same as that of storage node 34.

A cell plate 42 is formed on storage node 34 with a thin dielectric layer therebetween. Thus, storage node 34 and cell plate 42 form a stacked capacitor. A contact hole 36 is formed on intermediate pad 32. On contact hole 36, main bit lines MBL1 to MBL3 are formed. Accordingly, main bit lines MBL1 to MBL3 are connected to intermediate pad 32 via a contact hole 36.

Accordingly, when the potential of block selecting line BS2, for example, attains H level, source/drain region 24 becomes conductive with source/drain region 22 and source/drain region 25 becomes conductive with source/drain region 23. As a result, sub bit line $\overline{SBL12}$ is connected to main bit line MBL1 via selecting transistor Qb12 and intermediate pad 32. Sub bit line $\overline{SBL22}$ is connected to main bit line MBL2 via selecting transistor Qb22 and intermediate pad 32. Sub bit line $\overline{SBL32}$ is connected to main bit line MBL3 via selecting transistor Qb32 and intermediate pad 32.

Meanwhile, when the potential of block selecting line BS3 attains H level, source/drain region 24 in block B3 becomes conductive with source/drain region 22, and source/drain region 25 becomes conductive with source/drain region 23. As a result, sub bit line SBL13 is connected to main bit line MBL1 through selecting transistor Qa13 and intermediate pad 32. Sub bit line SBL23 is connected to main bit line MBL2 through selecting transistor Qa23 and intermediate pad 32. Sub bit line SBL33 is connected to main bit line MBL3 through selecting transistor Qa33 and intermediate pad 32.

As describe above, since intermediate pad 32 is formed so as to connect source/drain region 22 of the selecting transistor with the main bit line in this Embodiment 1, a small contact hole 30 can be formed by using self-align contact technique. Accordingly, even when the distance between block selecting line BS2 and block selecting line BS3 is short, the side surface of contact hole 30 would not be in contact with block selecting line BS2 or BS3. In addition, there is no need to provide any margin between contact hole 36 and block selecting line BS2 or BS3.

Furthermore, since intermediate pad 32 is formed at the same layer as storage node 34, there is no need to form another layer for intermediate pad 32 only. This intermediate pad 32 has a shape which is substantially the same as that of storage node 34 so that periodicity of the layout of storage node 34 would not be disturbed near the selecting transistor. Accordingly, capacitance of the stacked capacitor would be uniform even when dummy cells are not provided between the memory cells and the selecting transistors. Also, since block selecting line is formed with the same periodicity as that of the word line, uniformity of the capacitance of the stacked capacitor would not be destroyed near the selecting transistor. Also, two adjacent selecting transistors share one source/drain region 22 or 23 and this one source/drain region 22 or 23 is connected to the main bit line through one contact hole 30 so that the interval between the adjacent block selecting lines can be the same as the interval between the word lines. With such an arrangement, increase in the chip area can be suppressed sufficiently.

Embodiment 2

Figure 5:
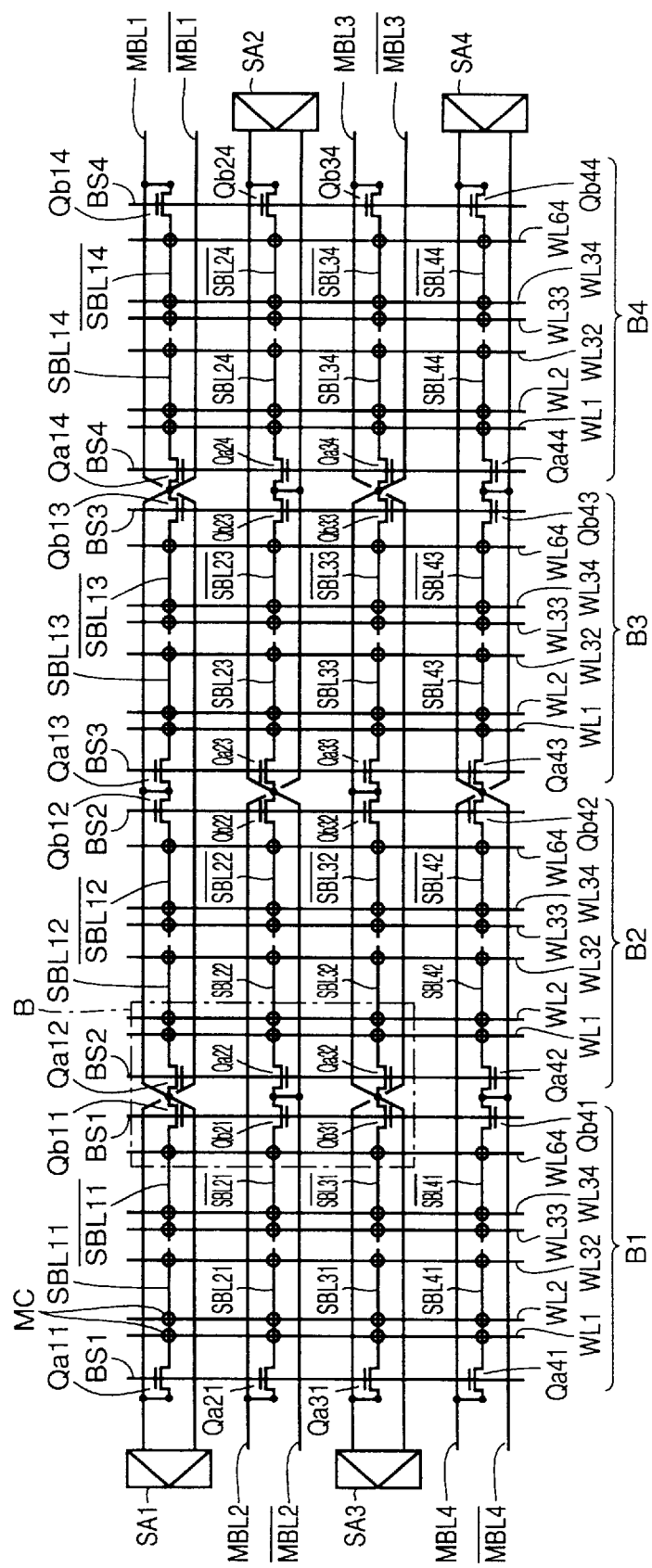
FIG. 5 is a circuit diagram showing a partial configuration of a DRAM having a hierarchical bit line structure according to Embodiment 2 of the present invention.

FIG. 5 is a circuit diagram showing the principal portions of a DRAM having a hierarchical bit line structure according to Embodiment 2 of the present invention. Referring to FIG. 5, this Embodiment 2 differs from Embodiment 1 of FIG. 2 in that a main bit line pair is twisted above a selecting transistor. For instance, a main bit line pair MBL1, $\overline{MBL1}$ is twisted above selecting transistors Qb11 and Qa12 as well as selecting transistors Qb13 and Qa14. A main bit line pair MBL2, $\overline{MBL2}$ is twisted above selecting transistors Qb22 and Qa23. A main bit line pair MBL3, $\overline{MBL3}$ is twisted above selecting transistors Qb31 and Qa32 as well as selecting transistors Qb33 and Qa34. A main bit line pair MBL4, $\overline{MBL4}$ is twisted above selecting transistors Qb42 and Qa43.

Figure 6:
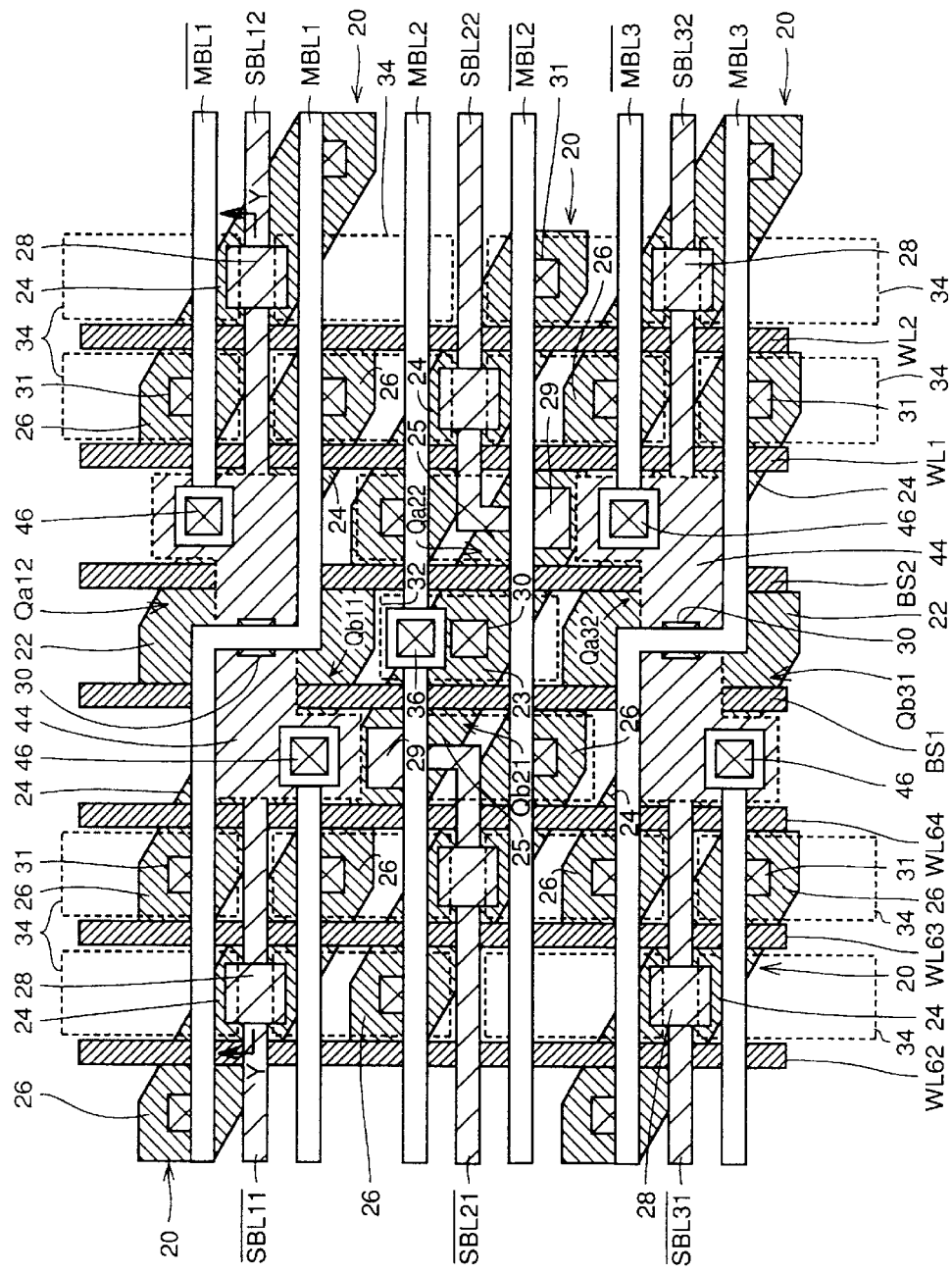
FIG. 6 is a layout diagram showing a specific configuration of portion shown as region B in FIG. 5.
Figure 7:
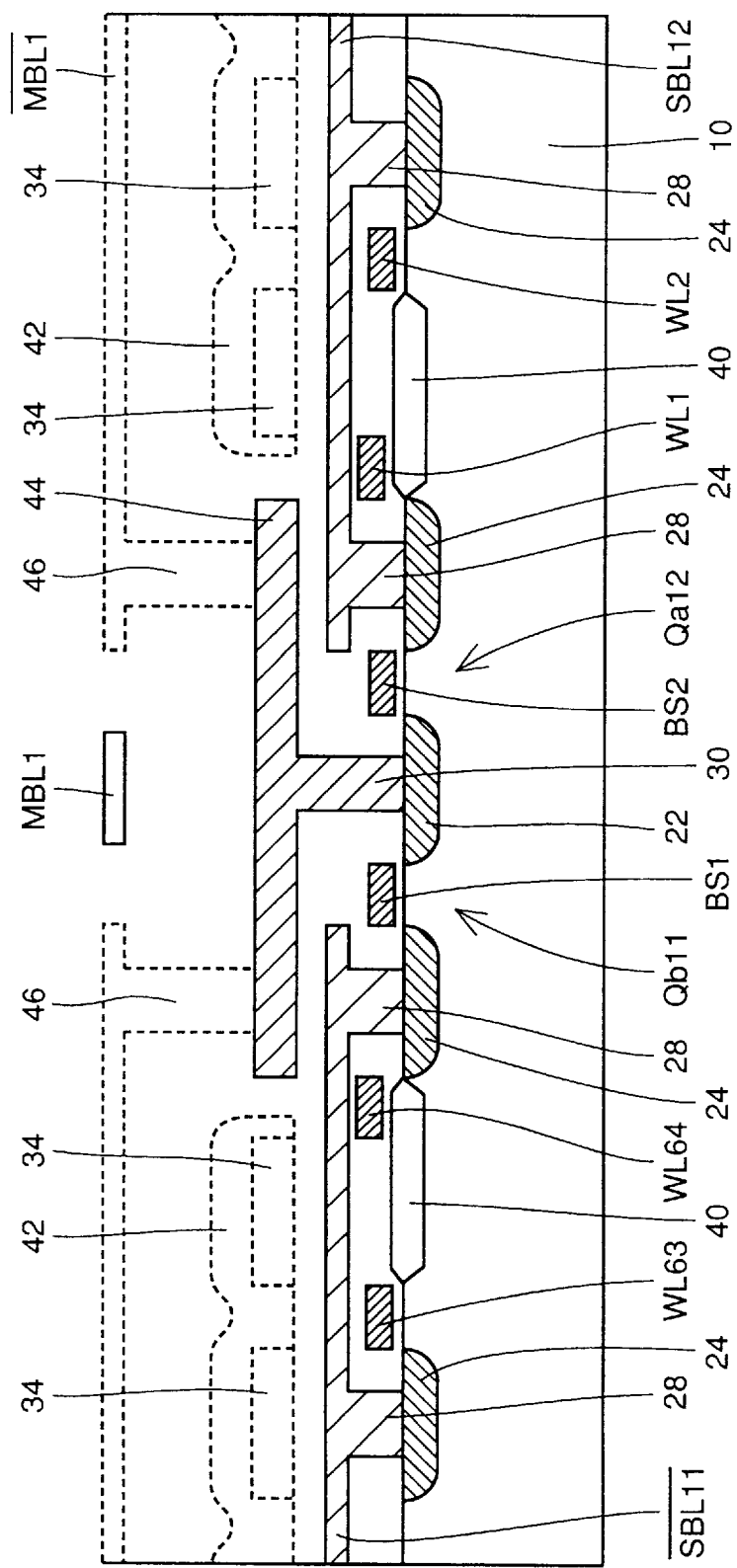
FIG. 7 is a cross sectional view taken along line Y—Y in FIG. 6.

FIG. 6 is a layout diagram showing the specific configuration of the portion denoted by B in FIG. 5. FIG. 7 is a cross sectional view taken along line Y—Y in FIG. 6.

FIG. 6 differs from FIG. 3 in that main bit line MBL1 is shown to be located at the upper side in block B1 while being located at the lower side in block B2. In addition, main bit line $\overline{MBL1}$ is shown to be located at the lower side in block B1 while being located at the upper side in block B2. Accordingly, main bit line $\overline{MBL1}$ is adjacent to main bit line MBL2 in block B1 and main bit line MBL1 is adjacent to main bit line MBL2 in block 2.

Main bit line pair MBL3, $\overline{MBL3}$ is located similarly to main bit line pair MBL1, $\overline{MBL1}$. Therefore, main bit line MBL3 is adjacent to main bit line $\overline{MBL2}$ in block B1 and main bit line $\overline{MBL3}$ is adjacent to main bit line $\overline{MBL2}$ in block B2.

In addition, FIG. 7 differs from FIG. 4 in that a coupling portion 44 having a wide area is formed on contact hole 30. Accordingly, this coupling portion 44 is in connection with source/drain region 22 through contact hole 30. As shown in FIG. 6 and FIG. 7, two contact holes 46 are formed on this one coupling portion 44. The portion of main bit line $\overline{MBL1}$ within block B1 is formed on one contact hole 46, and portion of main bit line MBL1 within block B2 is formed on the other contact hole 46. Thus, a portion of main bit line $\overline{MBL1}$ within block B1 is in connection with coupling portion 44 through one contact hole 46. The portion of main bit line $\overline{MBL1}$ within block B2 is in connection with coupling portion 44 through the other contact hole 46. Accordingly, the portion of main bit line $\overline{MBL1}$ within block B1 is connected to a portion of main bit line $\overline{MBL1}$ within block B2 through coupling portion 44. Main bit line $\overline{MBL3}$ shown in FIG. 6 is also formed in a manner similar to that of this main bit line $\overline{MBL1}$.

Accordingly, when the potential of block selecting line BS1 attains H level, sub bit line $\overline{SBL11}$, for example, is connected to main bit line $\overline{MBL1}$ via selecting transistor Qb11 and coupling portion 44. Sub bit line $\overline{SBL31}$ is connected to main bit line $\overline{MBL3}$ via selecting transistor Qb31 and coupling portion 44. Meanwhile, when the potential of block selecting line BS2 attains H level, sub bit line SBL12, for example, would be in connection with main bit line $\overline{MBL1}$ via selecting transistor Qa12 and coupling portion 44. Sub bit line SBL32 would be in contact with main bit line $\overline{MBL3}$ via selecting transistor Qa32 and coupling portion 44.

In accordance with this Embodiment 2, main bit line $\overline{MBL1}$ is adjacent to main bit line MBL2 in block B1 while main bit line MBL1 is adjacent to main bit line MBL2 in block B2. As a result, the noise applied to main bit line MBL2 from main bit line MBL1 and $\overline{MBL1}$, respectively, is canceled. This is because, when the potential of main bit line MBL1 attains H level, the potential of main bit line $\overline{MBL1}$ attains L level, and when the potential of main bit line MBL attains L level, the potential of main bit line $\overline{MBL1}$ would attain H level. Thus, since the main bit line pair is twisted, the noise received by a main bit line pair from the adjacent main bit line pair is canceled. In addition, since coupling portion 44 is formed at the same layer as storage node 34, there is no need to form another layer just for coupling portion 44. Furthermore, contact hole 33 connecting coupling portion 44 forming a portion of main bit line to source/drain region 22 of the selecting transistor can be formed by self-align contact technique. Accordingly, the side surface of contact hole 30 formed in this way would not be in contact with block selecting line even when the interval between the adjacent block selecting lines is short.

Since coupling portion 44 which is similar to storage node 34 is formed in the vicinity of the selecting transistor, the periodicity of storage node 34 is not disturbed in the vicinity of the selecting transistor, resulting in a substantially uniform capacitance of the stacked capacitor. Since there is no need to provide a dummy cell between a memory cell and the selecting transistor, increase in the chip area is suppressed. In order to improve the periodicity of storage node 34, it is desirable that the coupling portion has the same shape as that of storage node.

Embodiment 3

Figure 8:
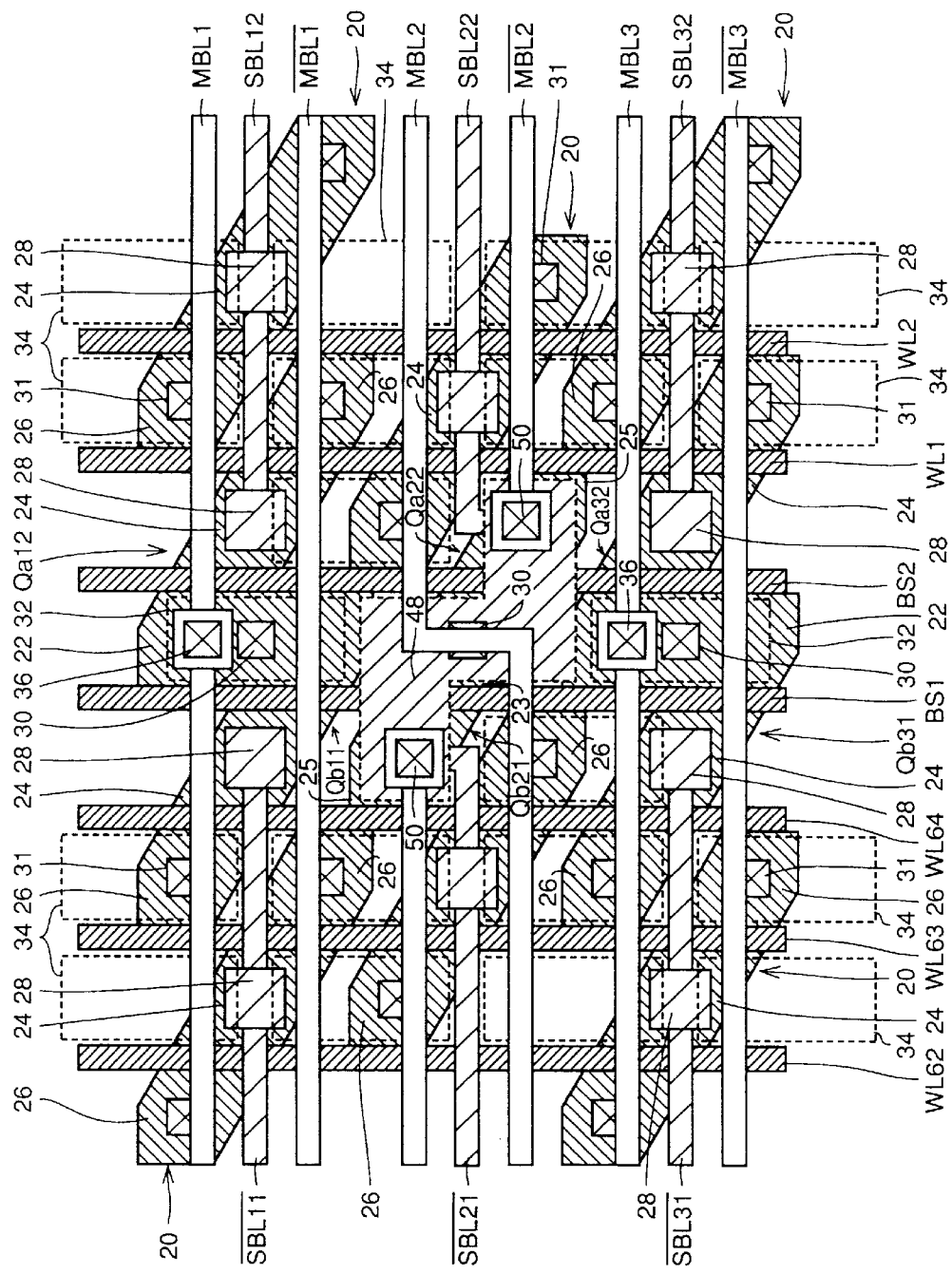
FIG. 8 is a layout diagram showing a partial configuration of a DRAM having a hierarchical bit line structure according to Embodiment 3 of the present invention.

FIG. 8 is a layout diagram showing the configuration of the principal portions in a DRAM having a hierarchical bit line structure according to Embodiment 3 of the present invention. Referring to FIG. 8, main bit line pair MBL2, $\overline{MBL2}$, instead of main bit line pair MBL1, $\overline{MBL1}$ and MBL3, $\overline{MBL3}$ shown in FIG. 6, is twisted above selecting transistors Qb21 and Qa22. Accordingly, main bit line MBL2 is adjacent to main bit line MBL3 within block B1, and is adjacent to main bit line $\overline{MBL1}$ within block B2. In addition, main bit line $\overline{MBL2}$ is adjacent to main bit line $\overline{MBL1}$ within block B1 and is adjacent to main bit line MBL3 within block B2. A contact hole 30 is formed on source/drain region 23 and a coupling portion 48 is formed further on this contact hole 30. Accordingly, this coupling portion 48 is in connection with source/drain region 23 through contact hole 30.

In addition, this coupling portion 48 is formed at the same layer as that of a storage node. On this coupling portion 48, two contact holes 50 are formed. A portion of main bit line $\overline{MBL2}$ within block B1 is formed on one contact hole 50 so that this portion would be in contact with coupling portion 48 through contact hole 50. A portion of main bit line $\overline{MBL2}$ within block B2 is formed on the other contact hole 50 so that this portion would be in contact with coupling portion 48 through contact hole 50. Accordingly, a portion of main bit line $\overline{MBL2}$ within block B1 would be in contact with a portion of main bit line $\overline{MBL2}$ within block B2 through coupling portion 48.

In accordance with this Embodiment 3, an effect similar to that of above-described Embodiment 2 is obtained.

Embodiment 4

Figure 9:
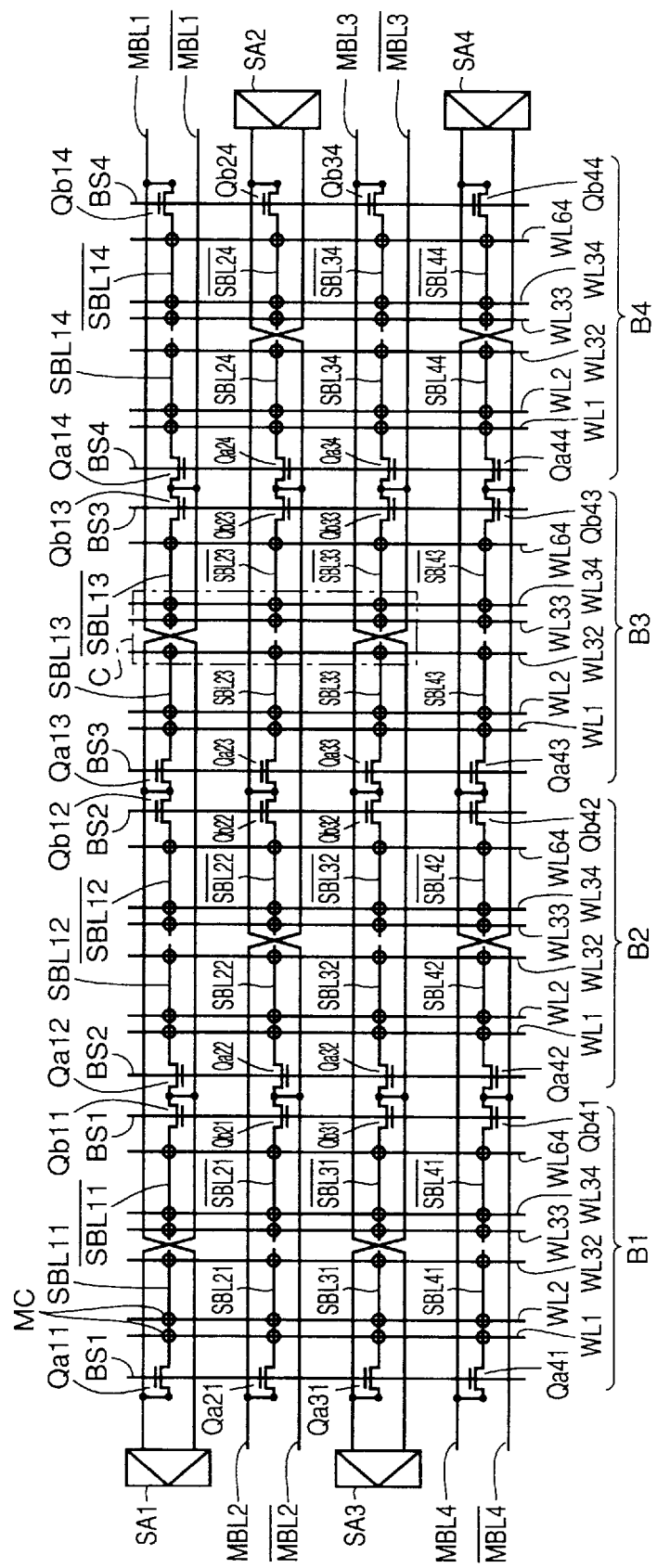
FIG. 9 is a circuit diagram showing a partial configuration of a DRAM having a hierarchical bit line structure according to Embodiment 4 of the present invention.
Figure 10:
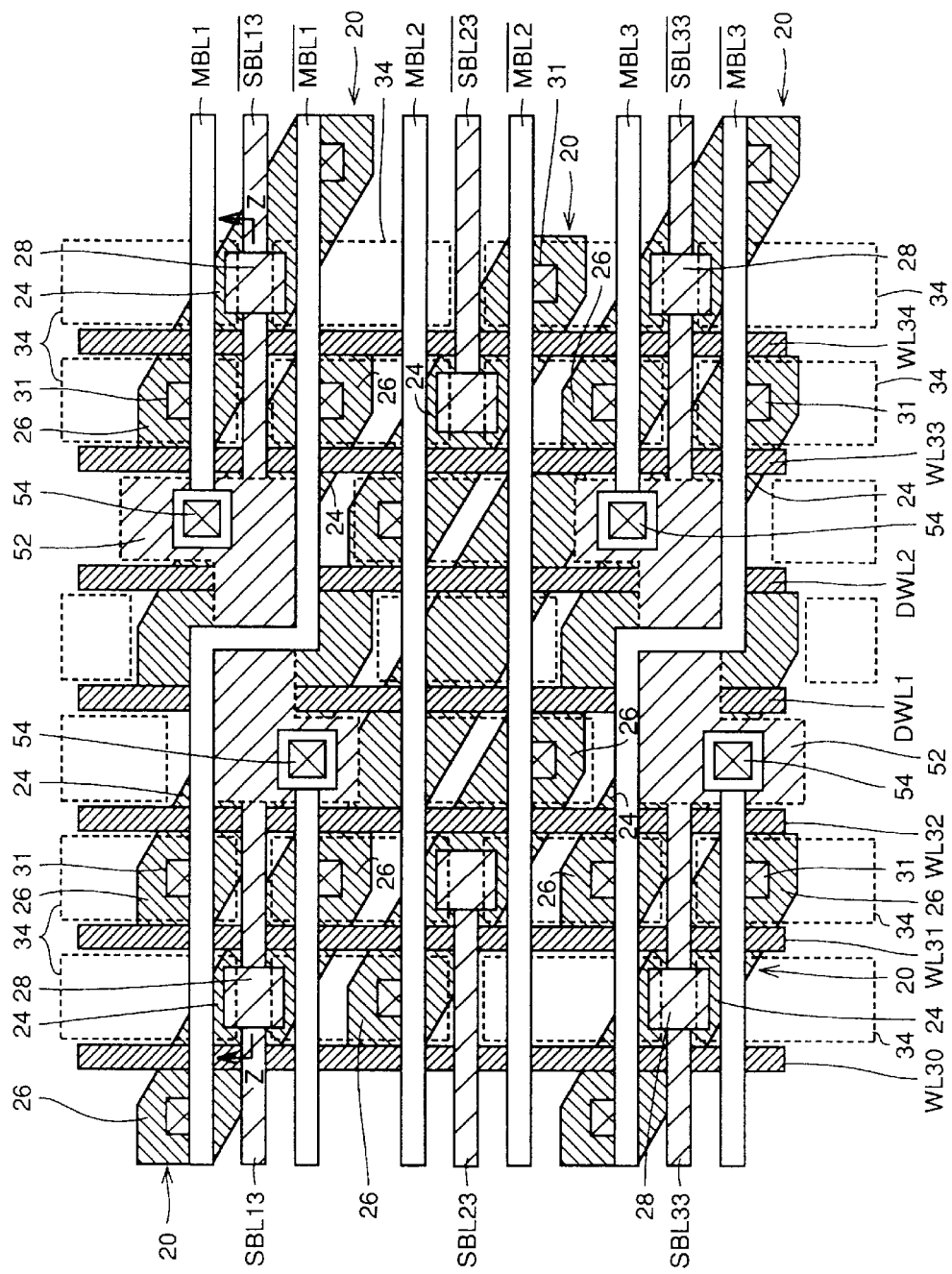
FIG. 10 is a layout diagram showing a specific configuration of the portion shown as region C in FIG. 9.
Figure 11:
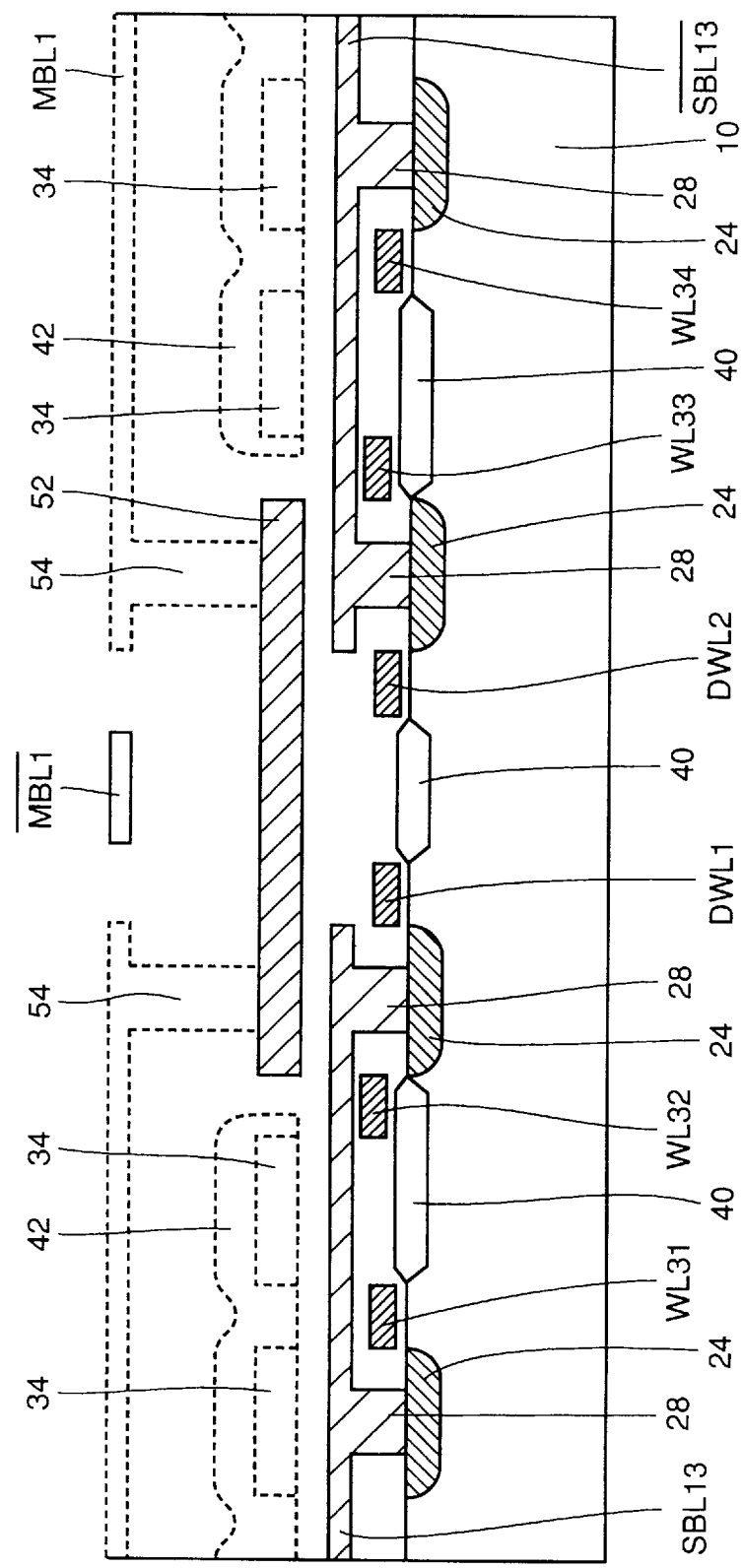
FIG. 11 is a cross sectional view taken along line Z—Z in FIG. 10.

FIG. 9 is a circuit diagram showing a configuration of principal portions in DRAM having a hierarchical bit line structure according to Embodiment 4 of the present invention. Referring to FIG. 9, this Embodiment 4 differs from Embodiment 2 of FIG. 5 in that a main bit line pair is twisted between one sub bit line and another sub bit line which forms a pair with it. For example, a main bit line pair MBL1, $\overline{MBL1}$ is twisted between sub bit lines SBL11 and $\overline{SBL11}$ as well as between sub bit lines SBL13 and $\overline{SBL13}$. A main bit line pair MBL2, $\overline{MBL2}$ is twisted between sub bit lines SBL12 and $\overline{SBL12}$ and between sub bit lines SBL24 and $\overline{SBL24}$. A main bit line pair MBL3, $\overline{MBL3}$ is twisted between sub bit lines SBL31 and $\overline{SBL31}$ and between sub bit lines SBL33 and $\overline{SBL33}$. A main bit line pair MBL4, $\overline{MBL4}$ is twisted between sub bit lines SBL42 and $\overline{SBL42}$ and between sub bit lines SBL44 and $\overline{SBL44}$. FIG. 10 is a layout diagram showing the specific configuration of the portion shown as C in FIG. 9. FIG. 11 is a cross sectional view taken along line Z—Z in FIG. 10.

Referring to FIGS. 10 and 11, a coupling portion 52 is formed between word lines WL32 and WL33. This coupling portion 52 is formed in the same layer as a storage node 34. Two contact holes 54 are formed on one coupling portion 52. The portion of main bit line MBL1 at the left hand side of FIG. 10 is in connection with coupling portion 52 through one contact hole 54, and the portion of main bit line MBL1 at the right hand side of FIG. 10 is in connection with coupling portion 52 through the other contact hole 54. Main bit line MBL3 is formed in a similar manner as that of main bit line MBL1.

Accordingly, main bit line MBL2 is adjacent to main bit line MBL1 at the left hand side of the FIGURE within block B3 and is adjacent to main bit line $\overline{MBL1}$ at the right hand side of the FIGURE within block B3. Main bit line $\overline{MBL2}$ is adjacent to main bit line $\overline{MBL1}$ at the left hand side of the FIGURE within block B3 and is adjacent to main bit line MBL3 at the right hand side of the FIGURE within block B3.

Since the twisted portion of the bit line pair is not located above the selecting transistor but is between the paired two sub bit lines as described above, a LOCOS isolation film 40 is formed under this twisted portion. Accordingly, this coupling portion 52 is not connected to silicon substrate 10 through contact hole 30 as in the case of coupling portion 44 shown in FIG. 7. There are two dummy word lines DWL1 and DWL2 formed between word lines WL32 and WL33. Dummy word lines DWL1 and DWL2 are placed with the same periodicity as that of word lines WL1 to WL64. Therefore, the uniformity of the capacitance of the stacked capacitor is not affected by the disturbance of the word line arrangement. In addition, although dummy word line DWL1 may be electrically floating, it is rather desirable that they are provided with ground potential. When dummy word lines DWL1 and DWL2 are provided with ground potential, they function as gate electrodes for field shield isolation such that leak current flowing between source/drain regions 24 which are adjacent to one another is further reduced.

In accordance with this Embodiment 4, the main bit line pair is twisted as in the above-described Embodiments 2 and 3 so that the noise received by the twisted main bit line pair from the adjacent other main bit line pairs is canceled. In addition, since the main bit line pair is twisted between two sub bit lines, the configuration at the vicinity of the selecting transistor would be as shown in FIG. 4.

Also, since coupling portion 52 is formed in the same layer as storage node 34, there is no need to form another layer just for coupling portion 52. Furthermore, the periodicity of storage nodes 34 is not disturbed between the paired two sub bit lines so that the capacitance of stacked capacitor would be uniform. Accordingly, there is no need to provide a dummy cell between the paired two sub bit lines, and increase in the chip area is suppressed.

Embodiment 5

Figure 12:
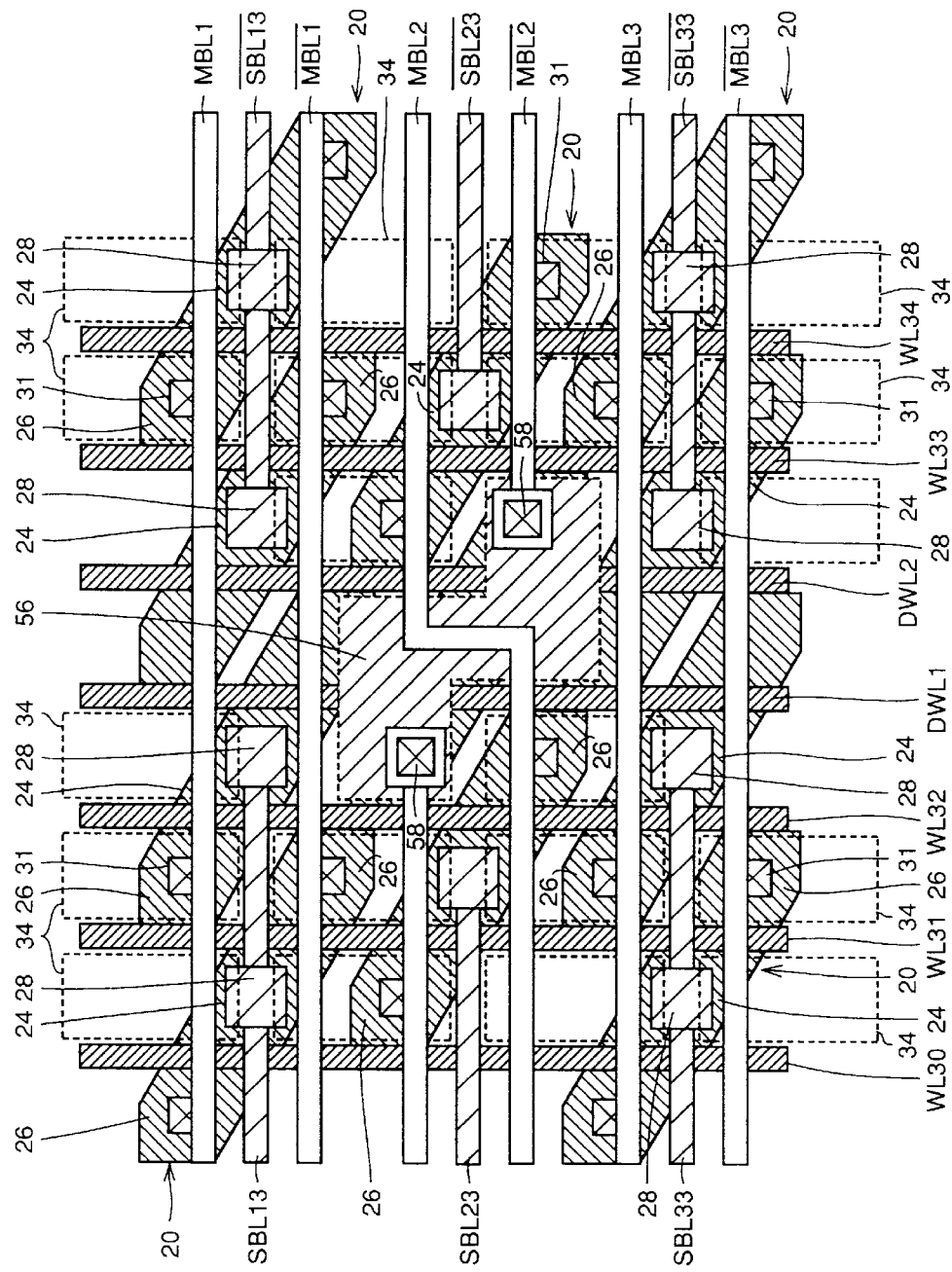
FIG. 12 is a layout diagram showing a partial configuration of a DRAM having a hierarchical bit line structure according to Embodiment 5 of the present invention.

FIG. 12 is a layout diagram showing the configuration of the principal portion in a DRAM having a hierarchical bit line structure according to Embodiment 5 of the present invention. Referring to FIG. 12, in this Embodiment 5, a main bit line pair MBL2, $\overline{MBL2}$, instead of main bit line pair MBL1, $\overline{MBL1}$ and MBL3, $\overline{MBL3}$ shown in FIG. 1, is twisted between a sub bit line SBL23 and a sub bit line $\overline{SBL23}$. Thus, a coupling portion 56 is formed at the same layer as a storage node between word lines WL32 and WL33, and is connected to main bit line $\overline{MBL2}$ at the left hand side of the FIGURE and main bit line $\overline{MBL2}$ at the right hand side of the FIGURE, respectively, through two contact holes 58 formed thereon. Accordingly, main bit line $\overline{MBL1}$ is adjacent to main bit line $\overline{MBL2}$ at the left hand side of FIG. 12, and is adjacent to main bit line MBL2 at the right hand side of FIG. 12. Main bit line MBL3 is adjacent to main bit line MBL2 at the left hand side of FIG. 12 and is adjacent to main bit line $\overline{MBL2}$ at the right hand side of FIG. 12.

According to this embodiment 5, an effect similar to that of the above-described Embodiment 4 can be obtained.

Embodiment 6

Figure 13:
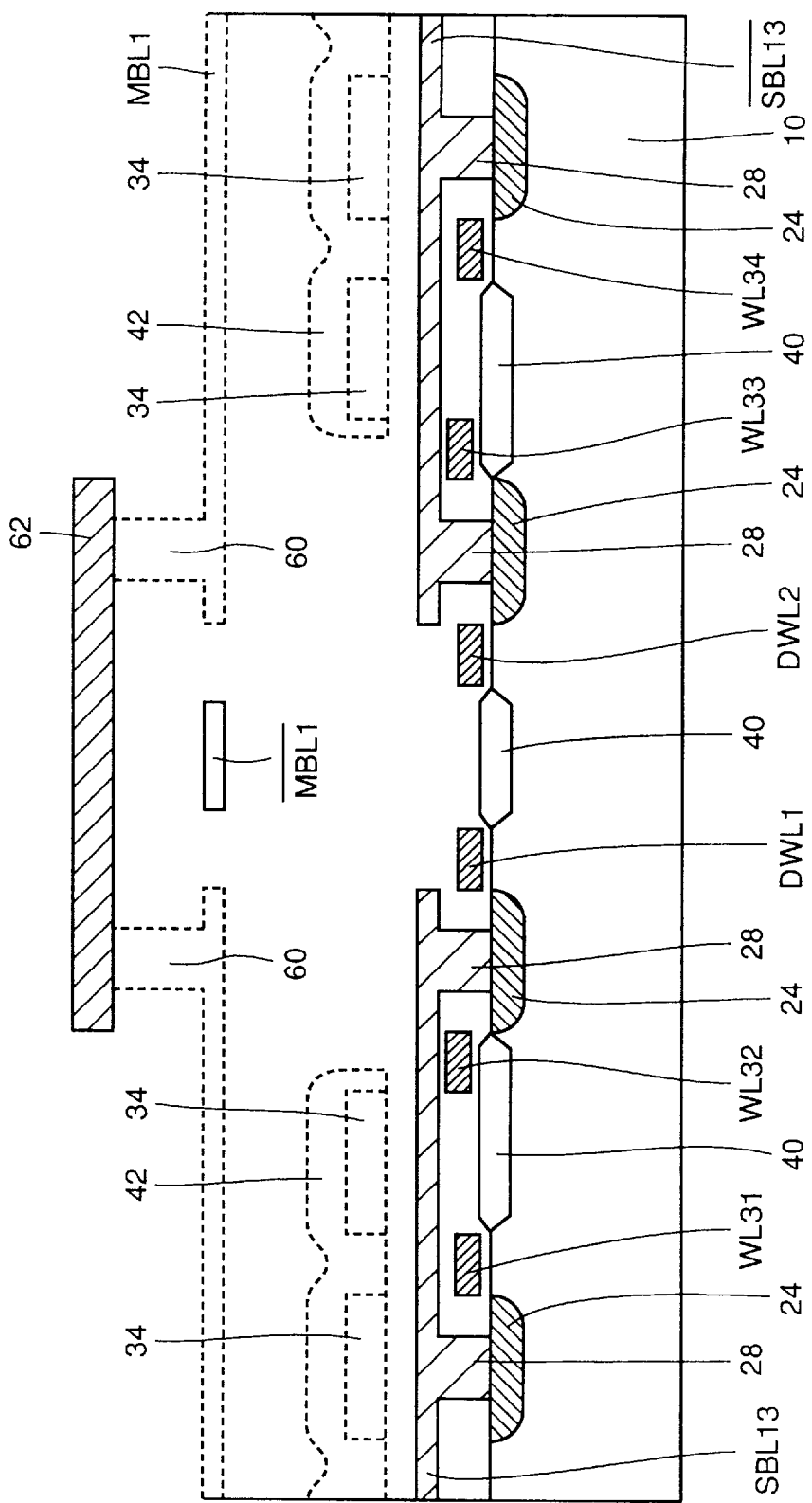
FIG. 13 is a cross sectional view showing partial configuration of a DRAM having a hierarchical bit line structure according to Embodiment 6 of the present invention.

FIG. 13 is a cross sectional view showing a configuration of the principal portions in DRAM having a hierarchical bit line structure according to Embodiment 6 of the present invention. Referring to FIG. 13, in this Embodiment 6, a coupling portion 62 is formed instead of coupling portion 52 shown in FIG. 11. This coupling portion 62 is formed by patterning an aluminum layer which is located above a main bit line MBL1. This coupling portion 62 is connected to main bit line MBL1 at the left hand side of FIG. 13 and to main bit line MBL1 at the right hand side of FIG. 13, respectively, through two contact holes 60 formed under this coupling portion 62. Accordingly, this main bit line pair MBL1, $\overline{MBL1}$ is also twisted as in the case shown in FIG. 11. Thus, the noise received by this main bit line pair MBL1, $\overline{MBL1}$ from adjacent other main bit line pairs is canceled. Thus, the coupling portion for twisting the main bit line pair may also be formed at a layer above the main bit line pair.

Based upon the foregoing, embodiments of the present invention has been described in detail. However, the scope of the invention is not limited to the above-described embodiments. For example, although the main bit line pair is folded and the sub bit line pair is open in the above embodiments, the main bit line pair may be open and the sub bit line pair may be folded. In addition, although source/drain region 22 shown in FIG. 3 is shared by two adjacent transistors, the adjacent two transistors may respectively have one independent source/drain region. In this case, however, contact hole 30 must be formed across these two independent source/drain regions.

In addition, instead of LOCOS isolation film 40 formed between paired two sub bit lines SBL13 and $\overline{SBL13}$ as shown in FIG. 11, a continuous source/drain region may be formed along dummy word lines DWL1 and DWL2 and a prescribed potential for precharging the sub bit lines may be applied to this source/drain region. In this case, when the potential of dummy word lines DWL1 and DWL2 attains H level, the prescribed potential applied to the source/drain region would be provided to sub bit lines SBL13 and $\overline{SBL13}$, respectively, thereby precharging these sub bit lines SBL13 and $\overline{SBL13}$.

Also, the present invention can be embodied with various improvements, modifications, variations and so on according to the knowledge of those skilled in the art without departing from the spirit of the invention. For example, the number of the above-described main bit lines, sub bit lines, blocks and so on and material used for the substrate, interconnections, electrodes and the like are not intended to be limited specifically.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor substrate;
   a plurality of sub bit line pairs formed on said semiconductor substrate;
   a main bit line pair formed along said plurality of sub bit line pairs in a layer located above said plurality of sub bit line
   a plurality of switching portions each provided corresponding to one of one and the other sub bit lines of said plurality of sub bit line pairs, connected between the corresponding sub bit line and one of one and the other main bit lines of said main bit line pair;
   a plurality of word lines formed on said semiconductor substrate to cross said plurality of sub bit line pairs;
   a plurality of memory cells provided corresponding to intersections of said plurality of sub bit line pairs and said plurality of word lines, each connected to one of one and other sub bit lines of the corresponding sub bit line pair and to corresponding word line,
   said plurality of switching portions each including
      a selecting transistor formed on said semiconductor substrate and having one source/drain region connected to corresponding sub bit line;
      a pad connected to the other source/drain region of said selecting transistor and the corresponding main bit line and formed at an intermediate layer between a layer of said plurality of sub bit line pairs and layer of said main bit line pair.

2. The semiconductor memory device in accordance with claim 1, wherein
   said main bit line pair is twisted.

3. The semiconductor memory device in accordance with claim 1, wherein
   said plurality of memory cells each includes a stacked capacitor having a storage node electrode formed at the same layer as said intermediate layer.

4. The semiconductor memory device in accordance with claim 3, wherein
   said pad has a shape which is substantially the same as that of said storage node electrode.

5. The semiconductor memory device in accordance with claim 1, wherein
   said main bit line pair is twisted above one of said plurality of switching portions.

6. The semiconductor memory device in accordance with claim 5, wherein
   said main bit line pair has a twisted portion above said one of the plurality of switching portions and parallel portions interconnected at said twisted portion, said twisted portion including an upper interconnect segment and a lower interconnect segment, said lower interconnect segment being formed by a layer between the layer of said main bit line pair and the layer of said plurality of sub bit line pairs.

7. The semiconductor memory device in accordance with claim 6, wherein
   said plurality of memory cells each includes a stacked capacitor having a strage node electrode formed by the same layer as said layer of said lower interconnect segment.

8. The semiconductor memory device in accordance with claim 6, wherein
   said interconnect segment is used as said pad.

9. A semiconductor memory device, comprising:
   a semiconductor substrate;
   a plurality of sub bit line pairs formed in a straight line on said semiconductor substrate, each including one sub bit line; and the other sub bit line located along the extension of said one sub bit line having one end located away from the opposite one end of said one sub bit line;

a main bit line pair formed along said plurality of sub bit line pairs in a layer above the layer of said plurality of sub bit line pairs;

a plurality of switching portions each provided corresponding to one of one and the other sub bit lines of said plurality of sub bit line pairs, connected between the corresponding sub bit line and one of one and the other main bit lines of said main bit line pair;

a plurality of word lines formed on said semiconductor substrate to cross one and the other sub bit lines of said plurality of sub bit line pairs; and a plurality of memory cells provided corresponding to intersections of one and the other sub bit lines of said plurality of sub bit line pairs and said plurality of word lines, each connected to corresponding sub bit line and corresponding word line, said plurality of switching portions each including a selecting transistor formed on said semiconductor substrate having one source/drain region connected to corresponding sub bit line; and a pad connected to the other source/drain region of said selecting transistor and corresponding main bit line, formed at an intermediate layer between the layer of said plurality of sub bit line pair and the layer of said main bit line pair.

10. The semiconductor memory device in accordance with claim 9, wherein said plurality of memory cells each includes a stacked capacitor having a storage node electrode formed at the same layer as said intermediate layer.

11. The semiconductor memory device in accordance with claim 10, wherein said pad has a shape which is substantially the same as that of said storage node electrode.

12. The semiconductor memory device in accordance with claim 9, wherein said main bit line pair has a twisted portion above said one of the plurality of switching portions and parallel portions interconnected at said twisted portion, said twisted portion including an upper interconnect segment and a lower interconnect segment, said lower interconnect segment being formed by a layer between the layer of said main bit line pair and the layer of said plurality of sub bit line pairs.

13. The semiconductor memory device in accordance with claim 12, wherein said interconnect segment is used as said pad.

14. A semiconductor memory device, comprising:

a semiconductor substrate;

a plurality of sub bit line pairs formed on said semiconductor substrate;

a main bit line pair formed along said plurality of sub bit line pairs in a layer above the layer of said plurality of sub bit line pairs;

a plurality of selecting transistors each provided corresponding to one of one and the other sub bit lines of said plurality of sub bit line pairs, having one source/drain region formed on said semiconductor substrate and connected to corresponding sub bit line;

a plurality of word lines formed on said semiconductor substrate to cross said plurality of sub bit line pairs; and a plurality of memory cells provided corresponding to intersections of said plurality of sub bit line pairs and said plurality of word lines each connected to one of one and the other sub bit lines of the corresponding sub bit line pair and to corresponding word line, said main bit line pair having a twisted portion above one of said plurality of selecting transistors; and one and/or the other main bit line of said main bit line pair has a coupling portion at the twisted portion connected to said portions of said one and/or the other main bit line of said main bit line pair said coupling portion being formed in a layer between the layer of the opposing side portion and said plurality of sub bit line pairs.

15. The semiconductor memory device in accordance with claim 14, wherein each of said plurality of memory cells includes a stacked capacitor having a storage node electrode formed in the same layer as the layer of said coupling portion.

16. The semiconductor memory device in accordance with claim 15, wherein said coupling portion has a shape which is substantially the same as that of said storage node electrode.

17. A semiconductor memory device, comprising:

a semiconductor substrate;

a plurality of sub bit line pairs formed on said semiconductor substrate in a straight line, each including one sub bit line; and the other sub bit line located along the extension of said one sub bit line, having one end located away from the opposite one end of said one sub bit line;

a main bit line pair formed on said semiconductor substrate along said plurality of sub bit line pairs and having a twisted portion between ends of one sub bit line and the other sub bit line of said plurality of sub bit line pairs;

a plurality of selecting transistors each provided corresponding to one of one and the other sub bit lines of said plurality of sub bit line pairs, connected between the other end of corresponding sub bit line and one of one and the other main bit line of said main bit line pair;

a plurality of word lines formed on said semiconductor substrate to cross one and the other sub bit lines of said plurality of sub bit line pairs; and a plurality of memory cells provided corresponding to intersections of one and the other sub bit lines of said plurality of sub bit line pairs and said plurality of word lines, each connected to corresponding sub bit line and corresponding word line.

18. The semiconductor memory device in accordance with claim 17, wherein one and/or the other main bit line of said main bit line pair includes a coupling portion at the twisted portion connected respectively to opposing side portions of said one and/or the other main bit line of said main bit line pair, said coupling portion being formed in a layer above the layer of the opposing side portions.

19. The semiconductor memory device in accordance with claim 17, wherein said main bit line pair is formed in a layer above the layer of said plurality of sub bit line pairs;

each of said plurality of memory cells includes a stacked capacitor having a storage node electrode formed at a layer between the layer of said main bit line pair and the layer of said plurality of sub bit line pairs; and one and/or the other main bit line of said main bit line pair includes coupling portions at the twisted portions, connected respectively to both side portions of said one and/or the other main bit line of said main bit line pair, said coupling portions being formed at the same layer as the layer of said storage node electrode.

20. The semiconductor memory device in accordance with claim 19, wherein said coupling portion has a shape which is substantially the same as the shape of said storage node electrode.

21. In a dynamic random access memory device having a hierarchical bit line structure including a main bit line, a sub bit line formed in a layer located lower than the layer of said main bit line, a word line located to cross said sub bit line, a memory cell connected to said sub bit line and said word line and having a stacked capacitor, and a selecting transistor connected between said main bit line and said sub bit line, an improvement comprising:

a pad formed at the same layer as the layer of a storage node electrode of said stacked capacitor, being in contact with said main bit line and a source/drain region of said selecting transistor.

* * * * *